(12) United States Patent
Rodriguez et al.

(10) Patent No.: US 11,688,715 B2
(45) Date of Patent: *Jun. 27, 2023

(54) SEMICONDUCTOR DIE WITH MULTIPLE CONTACT PADS ELECTRICALLY COUPLED TO A LEAD OF A LEAD FRAME

(71) Applicant: STMicroelectronics, Inc., Calamba (PH)

(72) Inventors: Rennier Rodriguez, Bulacan (PH); Rammil Seguido, Malolos (PH); Raymond Albert Narvadez, Sta. Rosa (PH); Michael Tabiera, Cabuyao (PH)

(73) Assignee: STMicroelectronics, Inc., Calamba (PH)

( * ) Notice: Subject to any disclaimer, the term of this patent is extended or adjusted under 35 U.S.C. 154(b) by 0 days.

This patent is subject to a terminal disclaimer.

(21) Appl. No.: 17/479,988

(22) Filed: Sep. 20, 2021

(65) Prior Publication Data

US 2022/0005782 A1   Jan. 6, 2022

Related U.S. Application Data

(63) Continuation of application No. 16/664,568, filed on Oct. 25, 2019, now Pat. No. 11,152,326.

(60) Provisional application No. 62/752,676, filed on Oct. 30, 2018.

(51) Int. Cl.
*H01L 23/00* (2006.01)
*H01L 23/495* (2006.01)

(52) U.S. Cl.
CPC .......... *H01L 24/45* (2013.01); *H01L 23/4952* (2013.01); *H01L 23/49513* (2013.01); *H01L 24/43* (2013.01)

(58) Field of Classification Search
CPC ... H01L 24/45; H01L 24/43; H01L 23/49513; H01L 23/4952
See application file for complete search history.

(56) References Cited

U.S. PATENT DOCUMENTS

| | | | |
|---|---|---|---|
| 6,455,926 | B2 | 9/2002 | Ho |
| 6,564,449 | B1 | 5/2003 | Tsai et al. |
| 2002/0177296 | A1 | 11/2002 | Ball |
| 2003/0032216 | A1 | 2/2003 | Nakaoka et al. |
| 2003/0151113 | A1 | 8/2003 | Hiraga |
| 2004/0021192 | A1 | 2/2004 | Beauchamp et al. |
| 2005/0191839 | A1 | 9/2005 | Wong et al. |
| 2007/0018338 | A1 | 1/2007 | Hosseini et al. |
| 2008/0237887 | A1 | 10/2008 | Takiar et al. |
| 2008/0242076 | A1 | 10/2008 | Takiar et al. |
| 2009/0174043 | A1 | 7/2009 | Pruitt |
| 2009/0321952 | A1 | 12/2009 | Liang et al. |

(Continued)

FOREIGN PATENT DOCUMENTS

WO   WO 2008/139273 A1   11/2008
WO   WO 2018/004695 A1   1/2018

*Primary Examiner* — Nathan W Ha
(74) *Attorney, Agent, or Firm* — Seed IP Law Group LLP

(57) ABSTRACT

The present disclosure is directed to a semiconductor die with multiple contact pads electrically coupled to a single lead via a single wire, and methods for fabricating the same. In one or more embodiments, multiple contact pads are electrically coupled to each other by a plurality of conductive layers stacked on top of each other. The uppermost conductive layer is then electrically coupled to a single lead via a single wire.

20 Claims, 5 Drawing Sheets

(56) References Cited

U.S. PATENT DOCUMENTS

| | | | |
|---|---|---|---|
| 2010/0270663 A1 | 10/2010 | Johnston et al. | |
| 2012/0074546 A1* | 3/2012 | Chong | H01L 25/0652 |
| | | | 257/676 |
| 2013/0119524 A1* | 5/2013 | Chan | H01L 24/27 |
| | | | 257/668 |
| 2013/0154067 A1* | 6/2013 | Pagaila | H01L 23/49541 |
| | | | 257/666 |
| 2013/0328194 A1* | 12/2013 | Har | H01L 23/4952 |
| | | | 257/773 |
| 2015/0303169 A1 | 10/2015 | Tran et al. | |
| 2015/0325504 A1 | 11/2015 | Ise | |
| 2016/0035652 A1 | 2/2016 | Yano et al. | |
| 2016/0107443 A1 | 4/2016 | Dodd et al. | |
| 2016/0329294 A1 | 11/2016 | Subido et al. | |
| 2016/0336277 A1 | 11/2016 | Kageyama et al. | |
| 2018/0019194 A1 | 1/2018 | Papillon | |
| 2019/0287880 A1* | 9/2019 | Somma | H01L 23/49575 |
| 2019/0371711 A1* | 12/2019 | Cho | H01L 24/09 |
| 2020/0105648 A1* | 4/2020 | Prajuckamol | H01L 23/49513 |

* cited by examiner

SEMICONDUCTOR DIE WITH MULTIPLE CONTACT PADS ELECTRICALLY COUPLED TO A LEAD OF A LEAD FRAME

BACKGROUND

Technical Field

The present disclosure is directed to electrically coupling a semiconductor die to a lead frame.

Description of the Related Art

A semiconductor package typically includes a lead frame and a semiconductor die. The lead frame includes a die pad to support the semiconductor die, and a plurality of leads to carry electrical signals between the semiconductor die and an external component, such as a printed circuit board.

The semiconductor die is often electrically coupled to the leads of the lead frame by a wire bonding process. Generally, a wire bonding process includes coupling a single wire between a single bonding pad on the semiconductor die and a single lead.

BRIEF SUMMARY

The present disclosure is directed to a semiconductor die with multiple contact pads electrically coupled to a single lead via a single wire, and methods for fabricating the same.

In one or more embodiments, multiple contact pads are electrically coupled to each other via a plurality of conductive layers stacked on top of each other. For example, the conductive layers may be stacked in a pyramid-like structure in which a first conductive layer is formed on a first contact pad, a second conductive layer is formed on a second contact pad, and a third conductive layer is formed on the first conductive layer and the second conductive layer. The uppermost conductive layer is then electrically coupled to a single lead via a single wire. For example, the wire has a first end that is attached to the third conductive layer; and a second end that is attached to the lead.

By using a single wire to electrically couple multiple contact pads to the same lead, many of the drawbacks associated with using multiple wires to electrically couple contact pads to a single lead may be avoided. For example, specialized or custom lead frames are unnecessary as most, if not all, lead frames include leads having sufficient surface area to accommodate a single wire. In addition, because the total amount of wires used to electrically couple contact pads to leads are decreased, the chance of wires inadvertently contacting each other and shorting each other decreases. Further, wires that are already attached to a lead are less likely to become damaged due to incidental contact from a capillary being used to attach another wire to the same lead as wires are spaced further apart from each other.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

Figure 1:
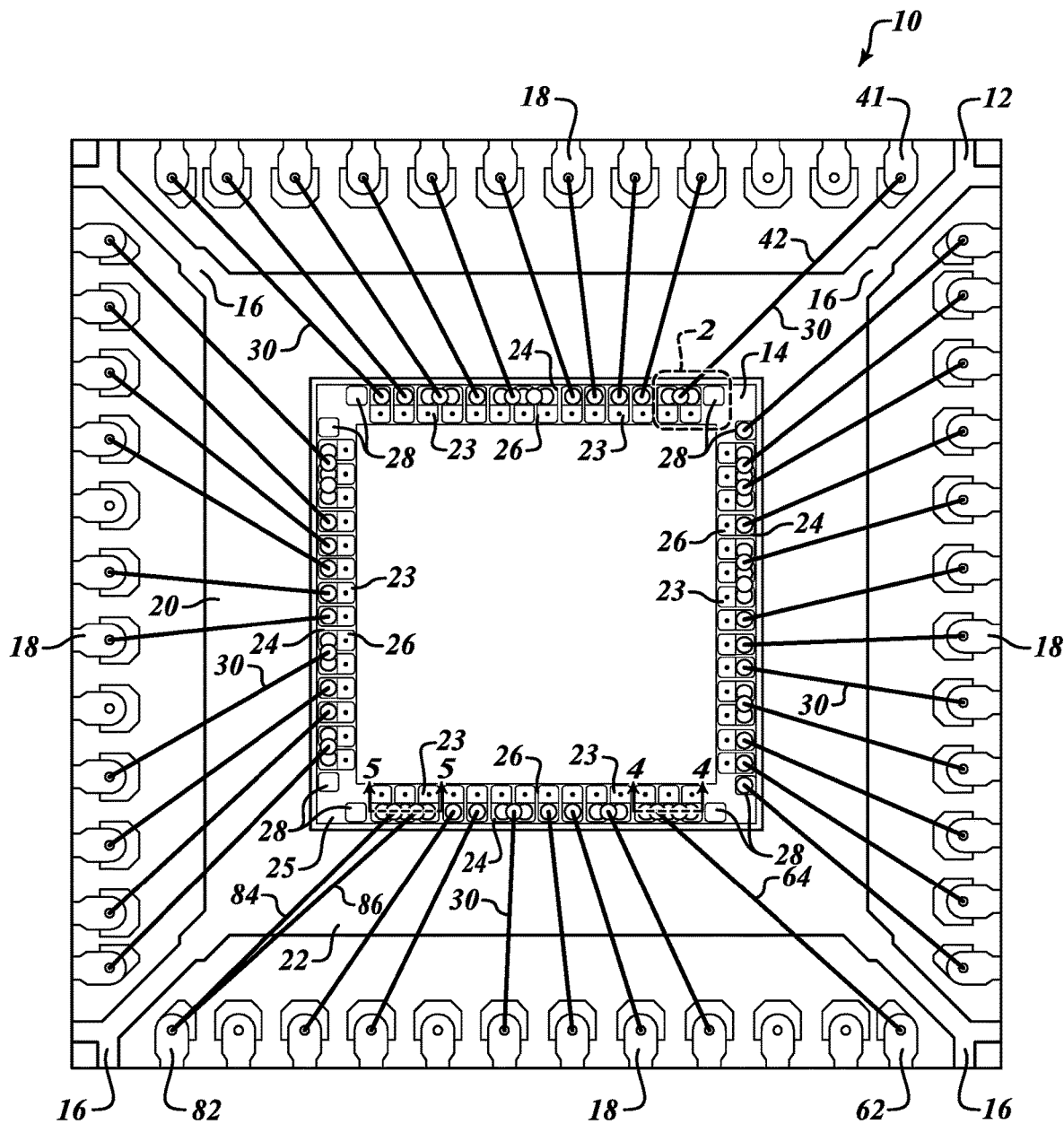
FIG. 1 is a plan view of a device according to an embodiment disclosed herein.

In the following description, certain specific details are set forth in order to provide a thorough understanding of various aspects of the disclosed subject matter. However, the disclosed subject matter may be practiced without these specific details. In some instances, well-known structures and methods of manufacturing and packaging electronic devices have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting or glass substrates, whether or not the components are coupled together into a circuit or able to be interconnected. Throughout the specification, the term "layer" is used in its broadest sense to include a thin film, a cap, or the like, and one layer may be composed of multiple sub-layers.

As previously discussed, a wire bonding process is often used to electrically couple a semiconductor die to a plurality of leads of a lead frame. Generally, a wire bonding process includes coupling wires between bonding pads on the semiconductor die and the leads. In a standard wire bonding process, the bonding pads are electrically coupled to the leads in one-to-one correspondence. That is, each bonding pad is electrically coupled to exactly one lead via a single wire. However, as semiconductor dies are increasingly including integrated circuits with greater complexity, it is desirable to electrically couple multiple bonding pads to the same lead such that multiple electrical signals may be carried to the same lead. This is beneficial as this allows multiple inputs/output signals of a semiconductor die to be in communication with a single lead.

One possible solution to electrically couple multiple bonding pads to the same lead is to use multiple wires. Namely, instead of electrically coupling bonding pads and leads in one-to-one correspondence as previously discussed, multiple bonding pads may be electrically coupled to the same lead via multiple wires. For example, three bonding pads may be electrically coupled to a single lead via three wires by coupling a wire between each of the three bonding pads and the single lead. This approach, however, has several drawbacks. For example, the leads of a lead frame often have limited surface area in which a wire may be attached. Many leads have sufficient surface area to accommodate a single wire. Thus, attaching multiple wires to a single lead may not be possible in some circumstances. Another drawback is that increasing the number of wires attached to a lead increases the chance of wires inadvertently contacting each other. That is, due to the wires being close in proximity to each other, the wires may accidently become shorted together. In addition, because of the tight clearance between wires, wires that are already attached to a lead may become damaged due to incidental contact from a capillary being used to attach another wire to the same lead. As another example, during a packaging process of the semiconductor die, the lead frame is often temporarily attached to a substrate for support using, for example, adhesive tape. When multiple wires are attached to the same lead, the pressure from repeatedly attaching the wires to the lead may cause the adhesive tape to overly stick to the lead, itself. Consequently, when the lead frame is eventually removed from the adhesive tape and the substrate, a residue of the adhesive will sometimes remain on the lead.

The present disclosure is directed to a semiconductor die with multiple contact pads electrically coupled to a single lead, and methods for fabricating the same. In some embodiments, the multiple contact pads are coupled to the single lead with a single wire.

FIG. 1 is a plan view of a device 10 according to an embodiment disclosed herein. The device 10 includes a lead frame 12 and a semiconductor die 14. The lead frame 12 provides a platform for the semiconductor die 14, and is used to carry electrical signals between the semiconductor die 14 and an external component, such as a printed circuit board. The lead frame 12 includes supports 16, a plurality of leads 18, and a die pad 20. A variety of shapes and sizes of the lead frame are envisioned, such as frames with different sizes of die pads or openings in the die pads.

The supports 16 are coupled to and extend from corners of the die pad 20. In some embodiments, the supports 16 are used to mount the lead frame 12 to a substrate, such as a printed circuit board. In other embodiments, the supports, arms, or extensions, provide structural support for the die pads within a package that includes molding compound around the die and the lead frame.

The leads 18 are positioned on each of the four sides of the die pad 20. The leads 18 carry electrical signals between the semiconductor die 14 (e.g., an integrated circuit within the semiconductor die 14) and an external source, such as a printed circuit board. As will be discussed in further detail below, the leads 18 are electrically coupled to the semiconductor die 14 via wires bonded between the leads 18 and the semiconductor die 14.

The lead frame 12 may include any number of leads and may have any type of arrangement. For example, the lead frame 12 may include 10, 20, or 30 leads on a single side, two sides, or three sides of the die pad 20.

The die pad 20 is physically coupled to the supports 16 and positioned between the leads 18. The die pad 20 provides a platform for the semiconductor die 14. In one embodiment, an upper surface 22 of the die pad 20 is a continuous, planar surface. In one embodiment, the supports 16 and the die pad 20 are a single, contiguous piece.

In one embodiment, the lead frame 12, including the supports 16, the leads 18, and the die pad 20, is made of a conductive material. For example, the lead frame 12 may be made of steel, aluminum, copper, gold, combinations thereof, or another type of conductive material.

The lead frame 12 may be fabricated using a variety of fabrication techniques. For example, in one embodiment, the lead frame 12 is formed by pattern deposition, a combination of blanket deposition and etching, or stamping a continuous sheet of material.

The semiconductor die 14 is positioned on the upper surface 22 of the die pad 20. In one embodiment, the semiconductor die 14 is attached to the die pad using adhesive material, such as adhesive tape or a glue. The semiconductor die 14 may include a variety of electronic components or devices. For example, the semiconductor die 14 may be a controller or processor, an application specific integrated circuit (ASIC), or any other type of integrated circuit. The semiconductor die 14 may be fabricated using fabrication processes known or later developed.

The semiconductor die 14 includes contact pads 23. The contact pads 23 are positioned on an upper surface 25 of the semiconductor die 14, and are electrically coupled to integrated circuits, including transistors, active and passive electronic components in the semiconductor die 14. The contact pads 23 are often referred to as bonding pads or contacts. The contact pads are conductive materials that are exposed on the upper surface of the die. In one embodiment, as shown in FIG. 1, the contact pads 23 are aligned along a perimeter of the semiconductor die 14.

In one embodiment, one or more of the contact pads 23 includes a bonding portion 24 and a probe portion 26. As will be discussed in further detail below, the bonding portion 24 receives ends of wire used to electrically couple the contact pads 23 to the leads 18. The probe portion 26 allows probes to measure the signals at various contact pads 23. For example, signals may be measured at one or more contact pads 23 to ensure that the semiconductor die 14 is functioning properly.

In one embodiment, one or more of the contact pads 23 includes a bonding portion, but do not include a probe portion. For example, as shown in FIG. 1, contact pads 28 of the contact pads 23 that are located at the corners of the semiconductor die 14 do not include probe portions.

The semiconductor die 14 may include any number of contact pads and may have any type of arrangement. For example, the semiconductor die 14 may include 50, 75, or 100 contact pads along a single side, two sides, or three sides of the semiconductor die 14.

Electrical signals are transmitted between the semiconductor die 14 (specifically the electronic components or devices in the semiconductor die 14) and the leads 18 via wires 30. In particular, ends of the wires 30 are bonded to the bonding portions 24 of the contact pads 23, and the opposite ends of the wires 30 are bonded to the leads 18.

Figure 2:
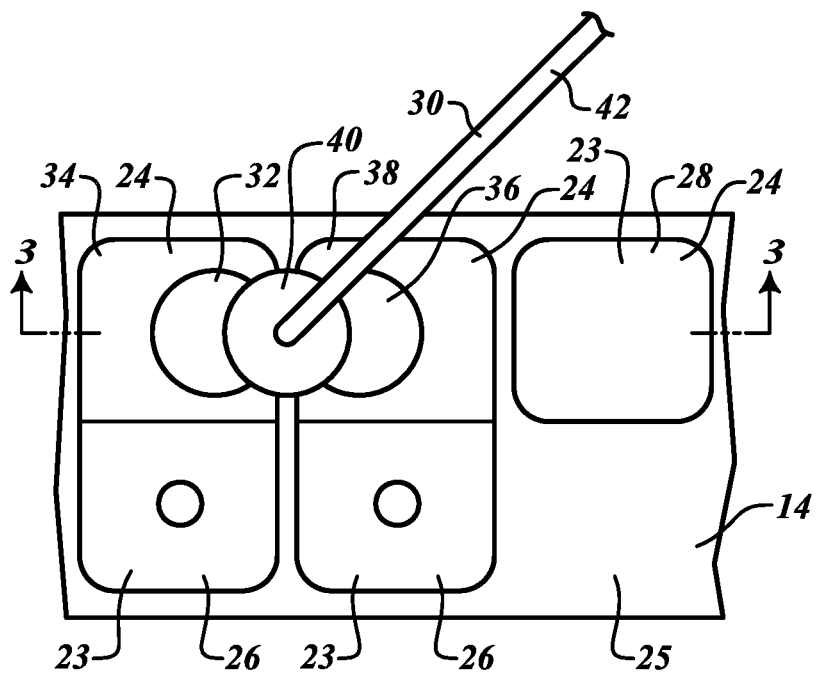
FIG. 2 is an enlarged plan view of a portion of the device of FIG. 1.
Figure 3:
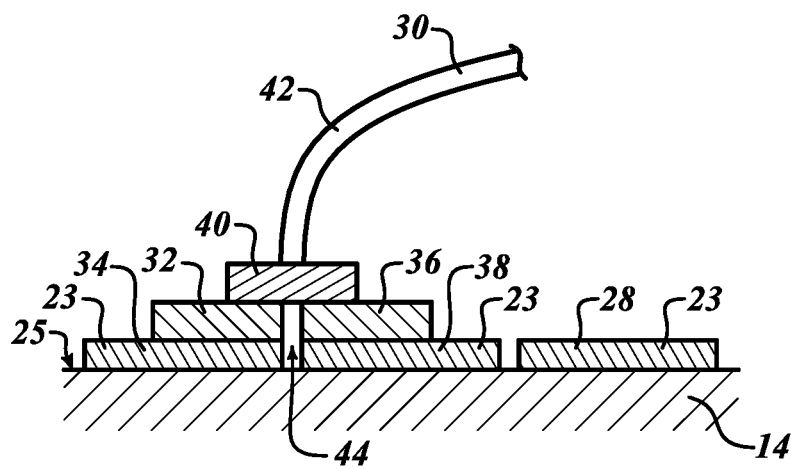
FIG. 3 is a cross-sectional view of the portion of the device of FIG. 1 along the axis shown in FIG. 2.

Multiple contact pads of the contact pads 23 may be electrically coupled to a single lead of the leads 18. FIG. 2 is an enlarged plan view of a portion of the device 10. FIG. 3 is a cross-sectional view of the portion of the device 10 along the axis shown in FIG. 2. In the embodiment shown in FIGS. 2 and 3, two contact pads are electrically coupled to a single lead via a single wire. It is noted that the various electrical components (e.g., conductive vias, transistors, resistors, metal levels, etc.) are not shown in FIG. 3 for simplicity purposes. It is beneficial to review FIGS. 2 and 3 together.

The two contact pads shown in FIGS. 2 and 3 are electrically coupled to each other by a plurality of conductive layers. A first conductive layer 32 is formed on a first contact pad 34 of the contact pads 23, a second conductive layer 36 is formed on a second contact pad 38 of the contact pads 23, and a third conductive layer 40 is formed on the first conductive layer 32 and the second conductive layer 36. The first conductive layer 32, the second conductive layer 36, and the third conductive layer 40, together, electrically couple the first contact pad 34 and the second contact pad 38 to each other.

The first contact pad 34 and the second contact pad 38 are then electrically coupled to a single lead 41 (shown in FIG. 1) of the leads 18 via a wire 42 of the wires 30. The wire 42 has a first end that is attached to the uppermost conductive layer, which in this case is the third conductive layer 40; and a second end, which is opposite to the first end, that is attached to the lead 41.

In one embodiment, the first conductive layer 32, the second conductive layer 36, and the third conductive layer 40 are stacked in a pyramid-like structure. For example, in the embodiment shown in FIG. 3, the first conductive layer 32 and the second conductive layer 36 are in a first plane (i.e., coplanar with each other), and the third conductive layer 40 is in a second plane above and parallel to the first plane. The third conductive layer 40 is positioned between the first conductive layer 32 and the second conductive layer 36, and directly overlies a space 44 (shown in FIG. 3) that separates the first conductive layer 32 and the second conductive layer 36 from each other.

In one embodiment, as shown in FIGS. 2 and 3, the third conductive layer 40 covers portions of the first conductive layer 32 and the second conductive layer 36. Stated differently, the third conductive layer 40 does not cover the entire upper surfaces of the first conductive layer 32 and the second conductive layer 36, and leaves portions of the first conductive layer 32 and the second conductive layer 36 exposed.

The first conductive layer 32, the second conductive layer 36, and the third conductive layer 40 may be made of any conductive material. For example, the first conductive layer 32, the second conductive layer 36, and the third conductive layer may be made of solder, gold, copper, conductive adhesive, aluminum, combinations thereof, or any other conductive material. In one embodiment, the first conductive layer 32, second conductive layer 36, and third conductive layer are conductive balls.

The configuration shown in FIGS. 2 and 3 allows the first contact pad 34 and the second contact pad 38 to be electrically coupled to the lead 41. Thus, electrical signals may be transmitted between the lead 41 and both the first contact pad 34 and the second contact pad 38. Further, as the first contact pad 34 and the second contact pad 38 are electrically coupled to the lead 41 via a single wire 42, many of the drawbacks discussed previously associated with using multiple wires to electrically couple contact pads to the same lead may be avoided.

The first and second conductive layers 32, 36 are illustrated as aligning with sidewalls of the contact pads 23. In some embodiments, the first and second conductive layers 32, 36 may be abutting, such that they are electrically coupled to each other. In some embodiments, the first and second conductive layers 32, 36 are replaced with a single conductive layer.

In some embodiments, one or more of the first, second, and third conductive layers 32, 36, 40 may be bumps or more rounded, ball shaped conductive layers formed using capillary wire bonding techniques.

The contact pads 23 and others in later figures are illustrated as being on the upper surface of the die, however, in some circumstances the contact pads will be recessed and within the die, such that only a top surface of the contact pad is exposed outside of the die.

Figure 4:
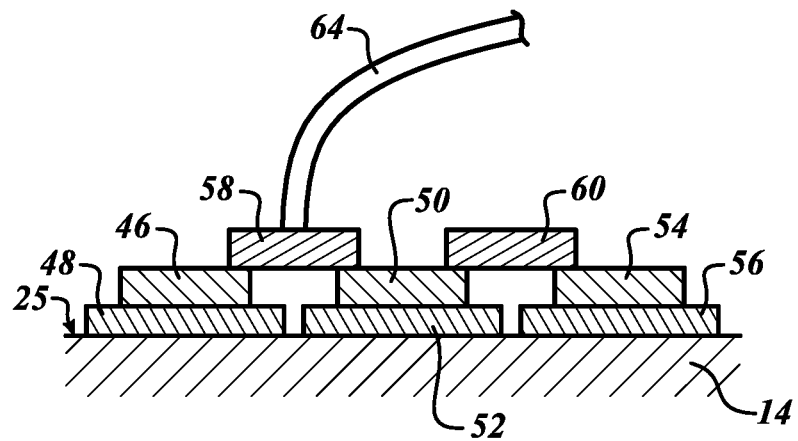
FIG. 4 is an enlarged cross-sectional view of a portion of the device of FIG. 1 along the axis shown in FIG. 1.

Although two contact pads are electrically coupled to each other in the embodiment shown in FIGS. 2 and 3, any number of contact pads may be electrically coupled to each other using a similar technique. For example, FIG. 4 is an enlarged cross-sectional view of a portion of the device 10 along the axis shown in FIG. 1. In the portion shown in FIG. 4, three contact pads are electrically coupled to a single lead via a single wire. It is noted that the various electrical components (e.g., conductive vias, transistors, resistors, metal levels, etc.) are not shown in FIG. 4 for simplicity purposes.

Similar to the embodiment shown in FIGS. 2 and 3, the three contact pads shown in FIG. 4 are electrically coupled to each other by a plurality of conductive layers. A first conductive layer 46 is formed on a first contact pad 48 of the contact pads 23, a second conductive layer 50 is formed on a second contact pad 52 of the contact pads 23, a third conductive layer 54 is formed on a third contact pad 56 of the contact pads 23, a fourth conductive layer 58 is formed on the first conductive layer 46 and the second conductive layer 50, and a fifth conductive layer 60 is formed on the second conductive layer 50 and the third conductive layer 54. The first conductive layer 46, the second conductive layer 50, the third conductive layer 54, the fourth conductive layer 58, and the fifth conductive layer 60, together, electrically couple the first contact pad 48, the second contact pad 52, and the third contact pad 56 to each other.

The first contact pad 48, the second contact pad 52, and the third contact pad 56 are then electrically coupled to a single lead 62 (shown in FIG. 1) of the leads 18 via a wire 64 of the wires 30. The wire 64 has a first end that is attached to the fourth conductive layer 58; and a second end, which is opposite to the first end, that is attached to the lead 62.

In one embodiment, the first conductive layer 46, the second conductive layer 50, the third conductive layer 54, the fourth conductive layer 58, and the fifth conductive layer 60 are stacked in a pyramid-like structure. For example, in the embodiment shown in FIG. 4, the first conductive layer 46, the second conductive layer 50, and the third conductive layer 54 are in a first plane (i.e., coplanar with each other); and the fourth conductive layer 58 and the fifth conductive layer 60 are in a second plane (i.e., coplanar with each other) above and parallel to the first plane. The fourth conductive layer 58 is positioned between the first conductive layer 46 and the second conductive layer 50, and the fifth conductive layer 60 is positioned between the second conductive layer 50 and the third conductive layer 54.

Different conductive layer shapes may also be used to implement the stacked contact pad arrangement. For example, the first, second, and third conductive layers 46, 50, 54 may be formed closer together, even abutting. In some embodiments, the first, second, and third conductive layers 46, 50, 54 are replaced with a single conductive layer. Similarly, in some embodiments, the fourth and fifth conductive layers 58 and 60 are replaced with a single conductive layer. The fourth and fifth conductive layers 58 and 60 may also be formed with larger bumps or balls, to fill or overlap any void or space between adjacent ones of the first, second, and third conductive layers.

Different diameter bumps may also be formed for the different layers of conductive bumps to accommodate different spacing, arrangements, and function of the die.

As mentioned above, the contact pads 23 may be recessed or otherwise formed in the semiconductor die 14, such that a top or exposed surface of the contact pads is coplanar with a top surface of the substrate. In such embodiments, a first layer of the conductive bumps (e.g., the first, second, and third conductive layers 46, 50, 54 discussed above) may be formed very close to each other and even on a surface of the top surface of the semiconductor die 14. By forming each of the first layer of conductive bumps close together or forming pairs of the bumps close together, this can minimize the space between adjacent ones of the bumps on which one of the second layer of conductive bumps may be formed.

In situations where the first conductive bumps are formed where there is a space between adjacent bumps, the second layer of bumps may be formed in or partially in the space between adjacent ones of the first conductive bumps.

Different aspects of the embodiments shown in FIGS. 1 to 4 may also be adjusted to meet various electrical requirements of the semiconductor die 14.

In one embodiment, the diameters of the wires 30 are altered to adapt with electrical criteria of the semiconductor die 14. For example, wires with larger diameters (e.g., 1 to 8 millimeters) may be used for cases in which wires with high resistances are desirable. Similarly, wires with smaller diameters (e.g., 10 to 20 micrometers) may be used for cases in which wires with low resistances are desirable.

Figure 5:
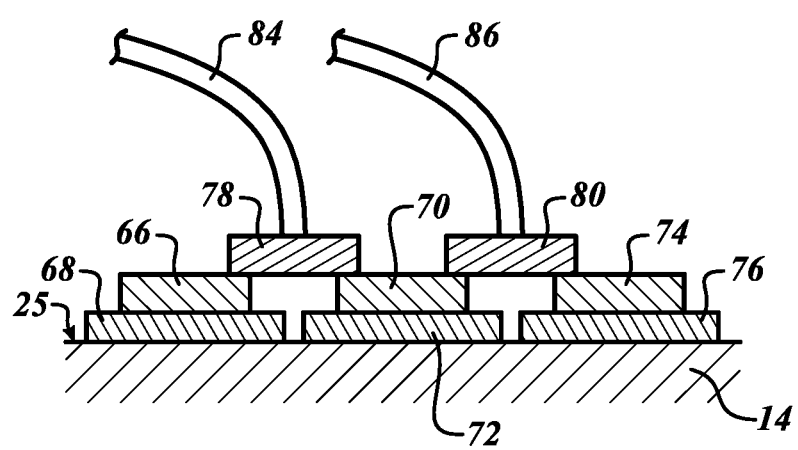
FIG. 5 is an enlarged cross-sectional view of a portion of the device of FIG. 1 along the axis shown in FIG. 1.

In one embodiment, the number of wires used to electrically couple contact pads to a lead is adjusted to adapt with electrical criteria of the semiconductor die 14. For example, instead of using a single wire (e.g., the embodiments shown in FIGS. 2 to 4), multiple wires may be used to electrically couple multiple contact pads to a single lead. For instance, FIG. 5 is an enlarged cross-sectional view of a portion of the device 10 along the axis shown in FIG. 1. The portion shown in FIG. 5 is similar to the embodiment shown in FIG. 4, except that two wires are used instead of a single wire. Namely, a first conductive layer 66 is formed on a first contact pad 68 of the contact pads 23, a second conductive layer 70 is formed on a second contact pad 72 of the contact pads 23, a third conductive layer 74 is formed on a third contact pad 76 of the contact pads 23, a fourth conductive layer 78 is formed on the first conductive layer 66 and the second conductive layer 70, and a fifth conductive layer 80 is formed on the second conductive layer 70 and the third conductive layer 74. The first contact pad 68, the second contact pad 72, and the third contact pad 76 are then electrically coupled to a single lead 82 (shown in FIG. 1) of the leads 18 via wires 84, 86, of the wires 30. The wire 84 has a first end that is attached to the fourth conductive layer 78; and a second end, which is opposite to the first end, that is attached to the lead 82. The wire 86 has a first end that is attached to the fifth conductive layer 80; and a second end, which is opposite to the first end, that is attached to the lead 82.

It is noted that the wires 84, 86 may also be attached to two different leads. For example, the wire 84 may have a first end that is attached to the fourth conductive layer 78; and a second end, which is opposite to the first end, that is attached to the lead 82. The wire 86 may then have a first end that is attached to the fifth conductive layer 80; and a second end, which is opposite to the first end, that is attached to a lead that is different from the lead 82.

Figure 6:
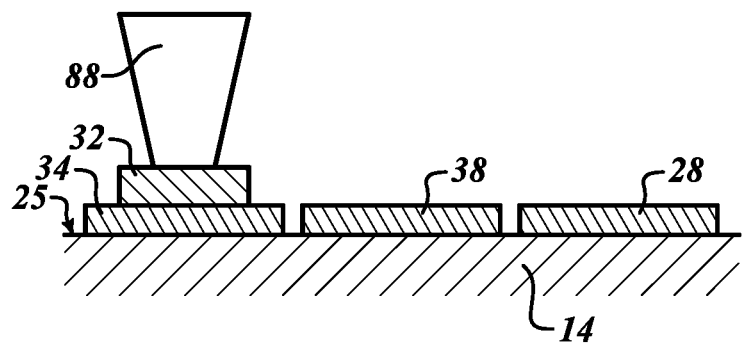
FIGS. 6 to 8 are cross-sectional views illustrating various stages of a method of electrically coupling multiple contact pads to a single lead according to an embodiment disclosed herein.
Figure 7:
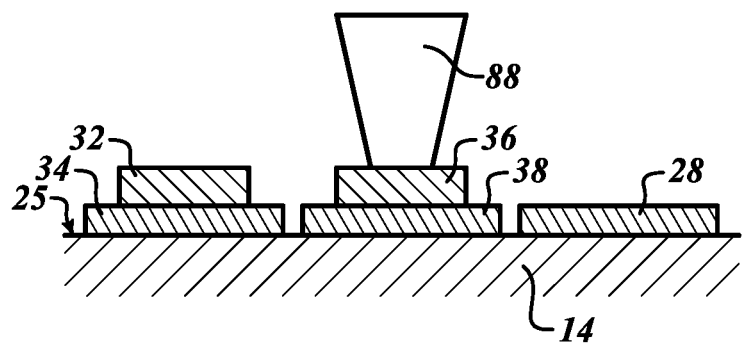
Figure 8:
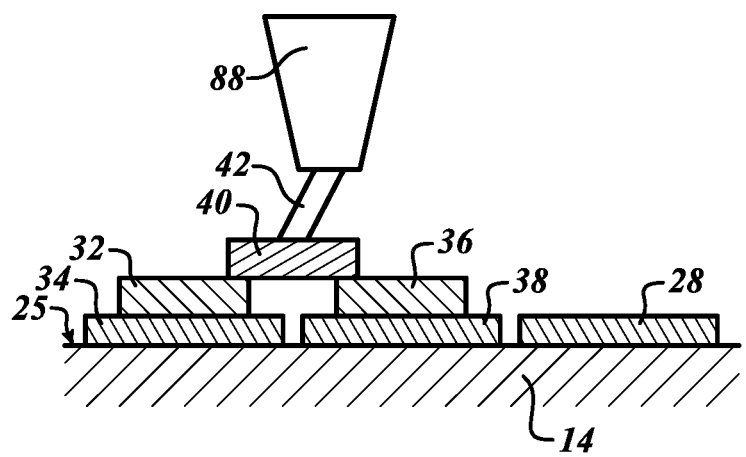

FIGS. 6 to 8 are cross-sectional views illustrating various stages of a method of electrically coupling multiple contact pads to a single lead according to an embodiment disclosed herein. In particular, FIGS. 6 to 8 are cross-sectional views illustrating various stages of a method of fabricating the embodiment shown in FIGS. 2 and 3.

Before the various conductive layers are formed, the semiconductor die 14 is fabricated and attached to the upper surface 22 of the die pad 20.

Subsequently, in FIG. 6, the first conductive layer 32 is formed on the first contact pad 34. The first conductive layer 32 may be formed using fabrication processes known or later developed. For example, in one embodiment, a capillary 88 is used to dispense conductive material on the first contact pad 34 to form the first conductive layer 32.

In FIG. 7, the second conductive layer 36 is formed on the second contact pad 38. The second conductive layer 36 may be formed using fabrication processes known or later developed. For example, in one embodiment, the capillary 88 is used to dispense conductive material on the second contact pad 38 to form the second conductive layer 36.

Subsequent to the first conductive layer 32 and the second conductive layer 36 being formed, the third conductive layer 40 is formed on the first conductive layer 32 and the second conductive layer 36. The third conductive layer 40 may be formed using fabrication processes known or later developed. For example, in one embodiment, the capillary 88 is used to dispense conductive material on the first conductive layer 32 and the second conductive layer 36 to form the third conductive layer 40.

In FIG. 8, a first end of the wire 42 is attached or bonded to the third conductive layer 40, and a second end, which is opposite to the first end, is attached to the lead 41. The wire 42 may be attached using fabrication processes known or later developed. For example, in one embodiment, the capillary 88 is used to place the wire 42 on the third conductive layer 40, while the conductive material for the third conductive layer 40 is being dispensed.

After the contact pads 28 have been electrically coupled to the leads 18, the lead frame 12, the semiconductor die 14, and the wires 30 are encapsulated by a molding compound. Subsequently, a singulation process may be performed to separate the device 10 from other devices or semiconductor packages.

Figure 9:
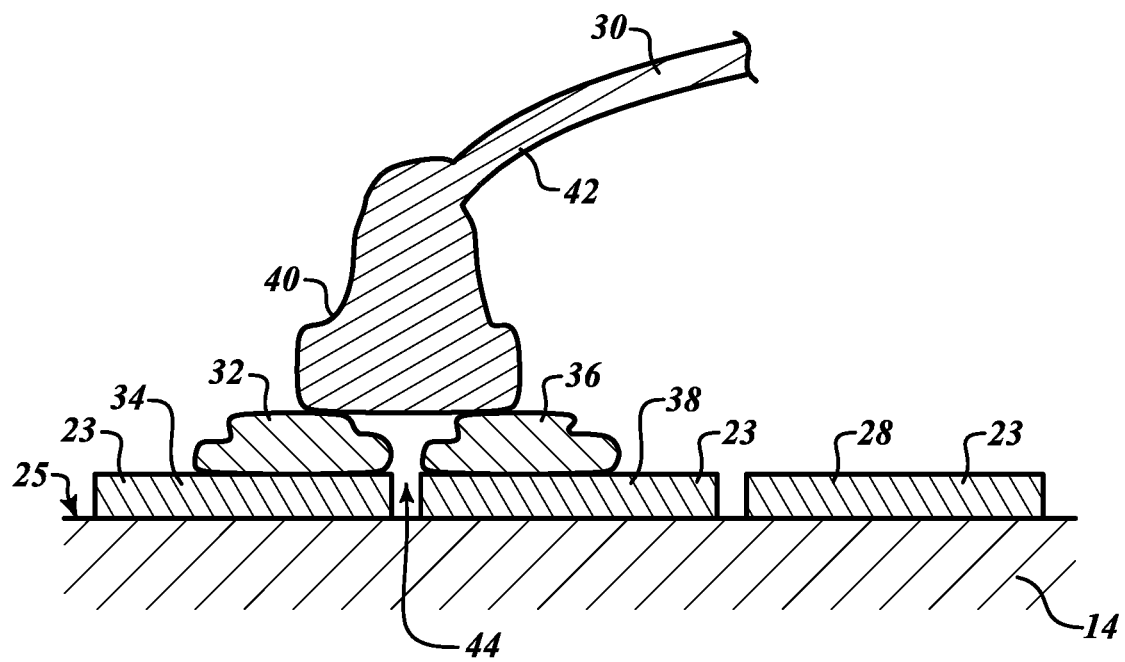
FIG. 9 is a cross-sectional view of the portion of the device of FIG. 1 along the axis shown in FIG. 2 according to another embodiment disclosed herein.

As previously discussed, in some embodiments, one or more of the first, second, and third conductive layers 32, 36, 40 may be bumps or more rounded, ball shaped conductive layers. Stated differently, the first, second, and third conductive layers 32, 36, 40 may have irregular shapes with curved edges. This may be due, in part, to the first, second, and third conductive layers 32, 36, 40 and the wire 42 being formed using the capillary wire bonding techniques described with respect to FIGS. 6 to 8. For example, FIG. 9 is a cross-sectional view of the portion of the device of FIG. 1 along the axis shown in FIG. 2 according to another embodiment disclosed herein. As shown in FIG. 9, the first, second, and third conductive layers 32, 36, 40 are not rectangular in shape as shown, for example, in FIG. 3. Instead, each of the first, second, and third conductive layers 32, 36, 40 have irregular, curved side surfaces and vary in width.

The various embodiments provide a semiconductor die with multiple contact pads electrically coupled to a single lead via a single wire, and methods for fabricating the same. By using a single wire to electrically couple multiple contact pads electrically coupled to a lead, many of the drawbacks associated with using multiple wires to electrically couple contact pads to the same lead may be avoided. For example, specialized or custom lead frames are unnecessary as most, if not all, lead frames include leads having sufficient surface area to accommodate a single wire. In addition, because the total amount of wires used to electrically couple contact pads to leads are decreased, wires are less likely to inadvertently contact each other and short each other. Further, wires that are already attached to a lead are less likely to become damaged due to incidental contact from a capillary being used to attach another wire to the same lead, as wires are spaced further apart from each other. As another example, as previously discussed, during a packaging process of a semiconductor die, a lead frame is often temporarily attached to a substrate for support using, for example, adhesive tape. When multiple wires are attached to the same lead, the pressure from repeatedly attaching the wires to the lead may cause the adhesive tape to overly stick to the lead, itself. Consequently, when the lead frame is eventually removed from the adhesive tape and the substrate, a residue of the adhesive will sometimes remain on the lead. This problem is avoided since a single wire is attached to a single lead, and, thus, less pressure will be applied to the same lead.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
    a frame including a lead;
    a die including a first contact pad and a second contact pad;
    a first conductive bump on the first contact pad;
    a second conductive bump on the second contact pad;
    a third conductive bump on a surface of the first conductive bump and a surface of the second conductive bump, the third conductive bump partially covering the surface of the first conductive bump and the surface of the second conductive bump; and
    a wire coupled to the third conductive bump and the lead.

2. The device of claim 1 wherein the die includes a third contact pad, and the device further includes:
    a fourth conductive bump on the third contact pad; and
    a fifth conductive bump on the surface of the second conductive bump and a surface of the fourth conductive bump, the fifth conductive bump partially covering the surface of the second conductive bump and the surface of the fourth conductive bump.

3. The device of claim 2, further comprising:
    a second wire coupled to the fifth conductive bump and the lead.

4. The device of claim 2 wherein the frame includes another lead, and the device further includes:
    a second wire coupled to the fifth conductive bump and the another lead.

5. The device of claim 1 wherein the first conductive bump and the second conductive bump are coplanar.

6. The device of claim 1 wherein the first and second conductive bumps are in a first plane, and the third conductive bump is in a second plane different from the first plane.

7. The device of claim 1 wherein the first contact pad and the second contact pad are on the same surface of the die.

8. A method, comprising:
    positioning a die on a frame, the die including a first contact pad and a second contact pad, the frame including a lead;
    forming a first conductive bump on the first contact pad;
    forming a second conductive bump on the second contact pad;
    forming a third conductive bump on a surface of the first conductive bump and a surface of the second conductive bump, the third conductive bump partially covering the surface of the first conductive bump and the surface of the second conductive bump; and
    coupling a wire to the third conductive bump and the lead.

9. The method of claim 8 wherein the die includes a third contact pad, and the method further includes:
    forming a fourth conductive bump on the third contact pad; and
    forming a fifth conductive bump on the surface of the second conductive bump and a surface of the fourth conductive bump, the fifth conductive bump partially covering the surface of the second conductive bump and the surface of the fourth conductive bump.

10. The method of claim 9, further comprising:
    coupling a second wire to the fifth conductive bump and the lead.

11. The method of claim 9 wherein the frame includes another lead, and the method further includes:
    coupling a second wire to the fifth conductive bump and the another lead.

12. The method of claim 8 wherein the first conductive bump and the second conductive bump are coplanar.

13. The method of claim 8 wherein the first and second conductive bumps are in a first plane, and the third conductive bump is in a second plane different from the first plane.

14. The method of claim 8 wherein the first contact pad and the second contact pad are on the same surface of the die.

15. A device, comprising:
    a frame including a lead;
    a die including a first contact pad and a second contact pad;
    a first conductive bump on the first contact pad;
    a second conductive bump on the second contact pad and abutting the first conductive bump;
    a third conductive bump on the first conductive bump and the second conductive bump; and
    a wire coupled to the third conductive bump and the lead.

16. The device of claim 15 wherein the die includes a third contact pad, and the device further includes:
    a fourth conductive bump on the third contact pad, the fourth conductive bump abutting the second conductive bump; and
    a fifth conductive bump on the second conductive bump and the fourth conductive bump.

17. The device of claim 16, further comprising:
    a second wire coupled to the fifth conductive bump and the lead.

18. The device of claim 16 wherein the frame includes another lead, and the device further includes:
    a second wire coupled to the fifth conductive bump and the another lead.

19. The device of claim 15 wherein the first conductive bump and the second conductive bump are coplanar.

20. The device of claim 15 wherein the first and second conductive bumps are in a first plane, and the third conductive bump is in a second plane different from the first plane.

* * * * *